United States Patent [19]

Kihara et al.

[11] Patent Number: 5,319,235

[45] Date of Patent: Jun. 7, 1994

[54] MONOLITHIC IC FORMED OF A CCD, CMOS AND A BIPOLAR ELEMENT

[75] Inventors: Kazuo Kihara, Yokohama; Hiroyuki Nakazawa, Kawasaki, both of Japan

[73] Assignee: Kabushiki Kaisha Toshiba, Kawasaki, Japan

[21] Appl. No.: 928,084

[22] Filed: Aug. 13, 1992

Related U.S. Application Data

[63] Continuation of Ser. No. 616,088, Nov. 20, 1990.

[30] Foreign Application Priority Data

Nov. 21, 1989 [JP] Japan ................. 1-302477

[51] Int. Cl.⁵ .............. H01L 29/76; H01L 29/94; H01L 29/00
[52] U.S. Cl. .................. 257/370; 257/369; 257/506; 257/215; 257/510
[58] Field of Search ........... 357/24, 43, 44, 48, 357/55, 59; 257/369, 370, 506, 509, 510, 511, 512

[56] References Cited

U.S. PATENT DOCUMENTS

| | | | |
|---|---|---|---|
| 4,089,021 | 5/1978 | Sato et al. | 357/20 |
| 4,140,558 | 2/1979 | Murphy et al. | 148/175 |
| 4,152,715 | 5/1979 | Wang | 357/24 |
| 4,163,245 | 7/1979 | Kinoshita | 357/51 |
| 4,230,951 | 10/1980 | Suzuki et al. | 307/200 |
| 4,255,677 | 3/1981 | Boonstra et al. | 307/304 |
| 4,672,645 | 6/1987 | Bluzer et al. | 377/60 |
| 4,746,963 | 5/1988 | Uchida et al. | 357/50 |
| 4,786,960 | 11/1988 | Jeuch | 357/42 |
| 4,799,098 | 1/1989 | Ikeda et al. | 357/43 |
| 4,825,275 | 4/1989 | Tomassetti | 357/43 |
| 4,859,624 | 8/1989 | Goto | 437/53 |
| 4,862,240 | 8/1989 | Watanabe et al. | 257/378 |
| 4,898,836 | 2/1990 | Zambrano et al. | 437/31 |
| 4,912,054 | 3/1990 | Tomassetti . | |
| 4,922,318 | 5/1990 | Thomas et al. | 357/43 |
| 4,926,233 | 5/1990 | Hutter | 257/370 |
| 4,994,888 | 2/1991 | Taguchi et al. | 257/378 |

FOREIGN PATENT DOCUMENTS 60-132367  7/1985  Japan .

OTHER PUBLICATIONS

Peter Van Zant, "Microchip Fabrication", Second Edition, Chapter Eleven, pp. 266-267 and Chapter Twelve—p. 314.

"Video Camera Signal Processing IC with CCD Delay Lines", T. Kiyofuji et al., CH2871-2/90/0000-03-42-1990 IEEE, pp. 342-343.

Primary Examiner—Rolf Hille
Assistant Examiner—Wael Fahmy
Attorney, Agent, or Firm—Banner, Birch, McKie & Beckett

[57] ABSTRACT

A composite semiconductor element includes a semiconductor substrate having a single crystal region projecting in the form of an island, an epitaxial growth layer formed on the semiconductor substrate so as to surround the single crystal region, an insulating isolation layer formed in predetermined regions of the epitaxial growth layer, of the single crystal region, and of the semiconductor substrate so as to insulate/isolate the epitaxial growth layer and the single crystal region from each other and to form a plurality of island-like element regions in the epitaxial growth layer and in the single crystal region, an n-channel MOS transistor and a CCD element respectively formed in element regions in the single crystal region, and a p-channel MOS transistor and a bipolar element respectively formed in element regions in the epitaxial growth layer.

6 Claims, 6 Drawing Sheets

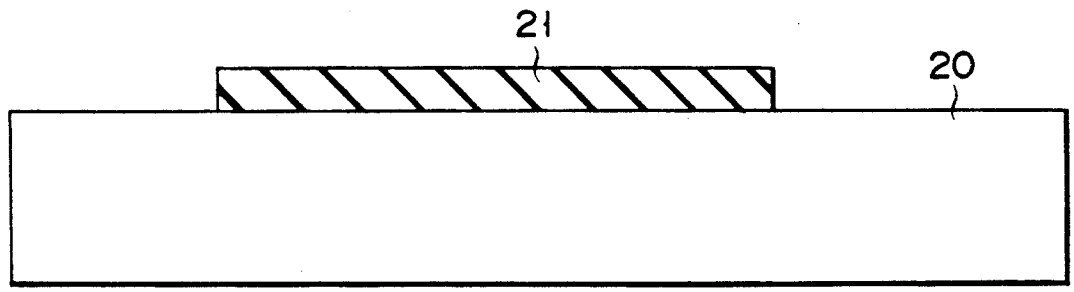
F I G. 2A
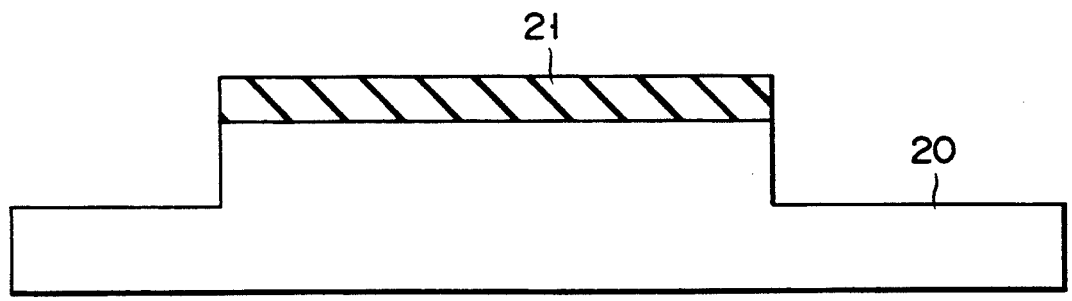
F I G. 2B

MONOLITHIC IC FORMED OF A CCD, CMOS AND A BIPOLAR ELEMENT

This application is a continuation of application Ser. No. 07/616,088, filed Nov. 20, 1990.

BACKGROUND OF THE INVENTION

1. Field of the Invention

The present invention relates to a composite semiconductor element obtained as a monolithic integrated circuit by forming a CCD (Charge Coupled Device) element, a CMOS element, and a bipolar element on a silicon semiconductor substrate and, more particularly, to a composite semiconductor element used for a TV or VTR.

2. Description of the Related Art

A composite integrated circuit element used for a TV or VTR is used as a monolithic integrated circuit obtained by forming a CCD delay line and a MOS transistor on a silicon semiconductor substrate. This CCD delay line serves to delay a signal and has an input/output circuit and a clock circuit respectively constituted by MOS transistors. With a recent tendency to reduce power consumption, these elements are constituted by CMOS elements so as to reduce the power source voltage from 9 V to 5 V. In addition, a circuit obtained by mounting a plurality of semiconductor elements in one package is currently available.

For example, a BiMOS element shown in FIG. 1 is designed such that the major surface of a p-type silicon semiconductor substrate is divided into a plurality of island regions A, B, and C by a selective oxide layer 2 for isolation, and a p-channel MOS transistor 3, an n-channel MOS transistor 4, and a CCD 5 are sequentially formed in the island regions A, B, and C, respectively to form a monolithic integrated circuit. The p-channel MOS transistor 3 is designed such that a so-called n-well region 6 is formed on the silicon semiconductor substrate 1, and an end portion of p-n junction formed by the n-well region 6 and substrate 1 is exposed on the upper surface of the silicon semiconductor substrate 1. This p-n junction end portion is protected by the selective oxide layer 2 for isolation to constitute a so-called planar structure. Since these structures are not different from known structures, a detailed description thereof will be omitted. Note that the MOS transistor includes a source region 7, a drain region 8, and a gate 9, and the CCD includes an extracting portion 10, thus constituting the BiMOS element.

In a conventional technique, a CCD element is formed on a silicon semiconductor substrate together with an n-channel (channel will be referred to as "ch" hereinafter) MOS transistor so as to constitute a monolithic integrated circuit. According to an arrangement of this circuit, a driving circuit, a clock driver, a sample/hold circuit, and an output circuit are generally arranged in addition to the CCD element. As described above, the power source voltage is changed from 9 V to 5 V for the following reason. With a recent tendency to form CMOS circuits so as to realize low power consumption, the power source voltage for, e.g., a bipolar element used together with such a CMOS circuit is required to be set to 5 V.

If, however, the power source voltage is set to 5 V, linearity of an operational amplifier used for the sample/hold circuit or the output circuit is degraded, and degradation of element characteristics is caused to decrease the yield. Furthermore, a delay line serves to only delay a signal, processing of this signal is performed by a circuit constituted by a bipolar element formed on another semiconductor substrate.

SUMMARY OF THE INVENTION

It is an object of the present invention to provide a composite semiconductor element in which CCD, CMOS, and bipolar elements are formed as a monolithic integrated circuit to improve linearity of a linear amplifier, thereby increasing the yield and expanding the function.

According to the present invention, there is provided a composite semiconductor element which includes a semiconductor substrate having a single crystal region projecting in the form of an island, an epitaxial growth layer formed on the semiconductor substrate so as to surround the single crystal region, an insulating isolation layer formed in predetermined regions of the epitaxial growth layer, of the single crystal region, and of the semiconductor substrate so as to insulate/isolate the epitaxial growth layer and the single crystal region from each other and to form a plurality of island-like element regions in the epitaxial growth layer and in the single crystal region, an n-channel MOS transistor and a CCD element respectively formed in element regions in the single crystal region, and a p-channel MOS transistor and a bipolar element respectively formed in element regions in the epitaxial growth layer.

According to the present invention, when a CCD, a CMOS transistor, and a bipolar transistor are formed on a semiconductor substrate as a monolithic integrated circuit, the respective elements are completely isolated from each other in order to maintain the conventional CCD characteristics and to satisfy characteristics as of a composite element. More specifically, a p-type semiconductor substrate is etched in advance by an amount required in the subsequent epitaxial step while prospective CCD and NchMOS formation regions are left. In addition, portions serving as buried regions are formed. Thereafter, epitaxial layers are selectively deposited to complete the buried regions and to form a selective epitaxial layer having a flat surface at the same level as that of a surface portion of the semiconductor substrate on which no selective epitaxial layer is deposited, thus facilitating micropatterning in the subsequent PEP (Photo Engraving Process).

Since the buried regions are formed near the boundaries between prospective bipolar transistor and PchMOS formation regions and the epitaxial layer, insulation/isolation of the respective regions can be completed by performing trench isolation as element isolation. With this process, the prospective CCD formation region is not constituted by the epitaxial layer but by the p-type semiconductor substrate, thus satisfactorily maintaining the characteristics of the conventional structure. In addition, since the bipolar transistor and the PchMOS transistor are formed in the n-type epitaxial layer, formation of an n-well is facilitated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 2A to 2M are sectional views showing an arrangement of a composite integrated circuit according to an embodiment of the present invention in the order of manufacturing steps.

DETAILED DESCRIPTION OF THE PREFERRED EMBODIMENTS

An arrangement of a composite integrated circuit according to an embodiment of the present invention will be described below in the order of manufacturing steps with reference to FIGS. 2A to 2M.

As shown in FIG. 2A, a p-type silicon semiconductor substrate 20 having a resistivity of 20 $\Omega$cm or less is prepared. A silicon oxide layer 21 having a thickness of about 10,000 Å is formed on the upper surface of the silicon semiconductor substrate 20 by CVD (Chemical Vapor Deposition). The resultant structure is then annealed at 900° C. The silicon oxide layer 21 is subjected to PEP (Photo Engraving Process) so as to be left on only prospective CCD and NchMOS formation regions.

As shown in FIG. 2B, the silicon semiconductor substrate is etched to a depth of 3 to 4 μm by a hydrofluoric acid/nitric acid etching solution using the remaining silicon oxide layer 21 as a mask. This depth of 3 to 4 μm corresponds to the thickness of an epitaxial layer formed by epitaxial growth (to be described later).

Figure 2C:
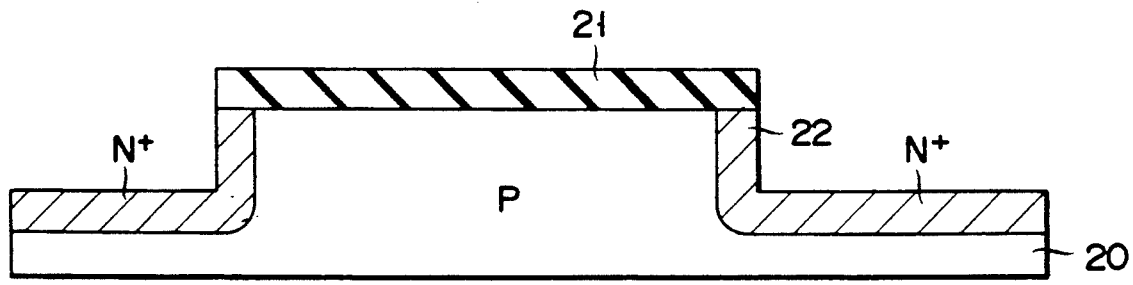

As shown in FIG. 2C, As or Sb is doped into the exposed portion of the silicon semiconductor substrate 20 by solid-phase diffusion or ion implantation using the remaining silicon oxide layer 21 as a mask so as to perform n+-type diffusion, thus forming n+-type layers 22 on the entire upper surface of the substrate 20 except for the prospective CCD and NchMOS formation regions. For example, this n+-type layer 22 is set to have a resistivity p$\rho$g=18 to 25 $\Omega$/□ and a diffusion depth Xj=4 μm.

Figure 2D:
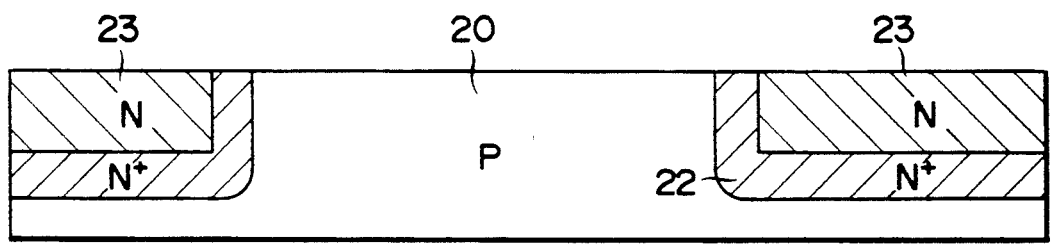

As shown in FIG. 2D, epitaxial layers 23 are grown on the exposed n+-type layers 22 so as to form a flat surface at the same level as that of the major surface of the silicon semiconductor substrate 20. For example, epitaxial growth reaction is caused by using SiCl$_4$, H$_2$, and PH$_3$ at a temperature of 1,170° C. or using SiH$_2$Cl$_2$, H$_2$, HCl, and PH$_3$ at a temperature of 1,150° C. However, no n-type epitaxial layer 23 is grown on the prospective CCD and NchMOS formation regions masked by the silicon oxide layer 21. After the epitaxial layer 23 is formed to have a thickness of 3 to 4 μm and a sheet resistance $\rho$s=1.5 to 2.0 $\Omega$cm, the silicon oxide layer 21 on the prospective CCD and NchMOS formation regions is removed, and a surface flattening process is performed.

Figure 2E:
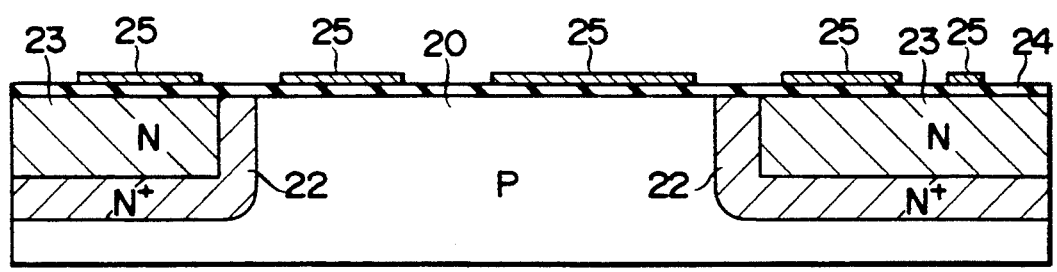
Figure 2F:
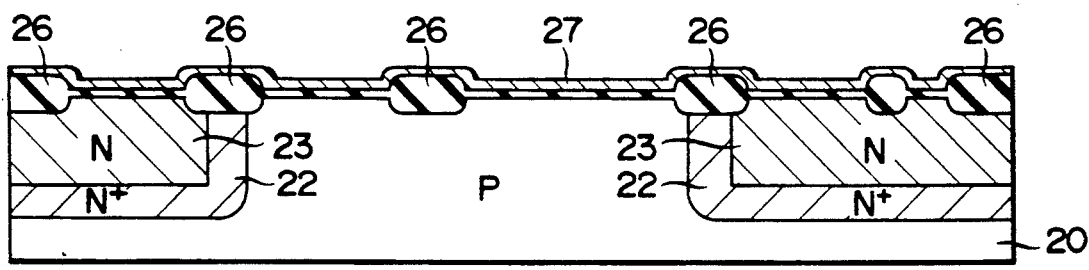

As shown in FIG. 2E, while the silicon semiconductor substrate 20 is held in an atmosphere of H$_2$+O$_2$ maintained at a temperature of 950° C., a silicon oxide layer 24 as a 900-Å thick oxide layer is formed on the flat major surface of the substrate 20. A 700-Å thick silicon nitride layer 25 is formed on the entire upper surface of the silicon oxide layer 24. A predetermined region of the silicon nitride layer 25 is patterned by PEP. Subsequently, as shown in FIG. 2F, selective oxidation is performed by using the silicon nitride layer 25 as a mask to form a thick silicon oxide layer 26 having a thickness of 8,000 to 10,000 Å on a field portion of the silicon semiconductor substrate 20. After the silicon nitride layer 25 is removed, a 2,000-Å thick Si$_3$N$_4$ layer 27 is formed on the major surface of the silicon semiconductor substrate 20 including the silicon oxide layer 26.

Figure 2G:
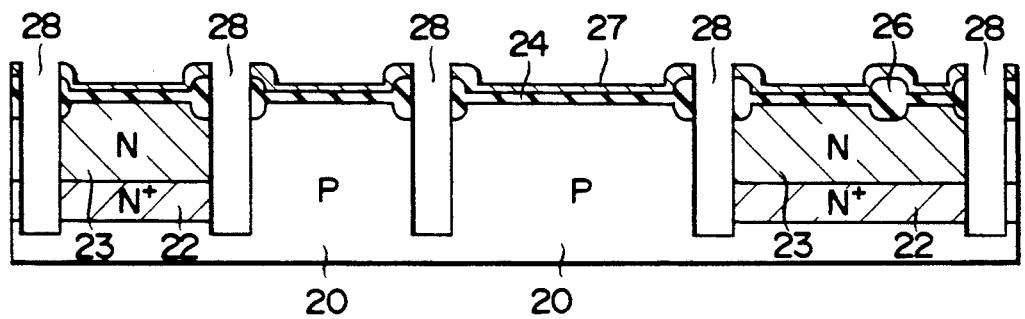

As shown in FIG. 2G, a resist film (not shown) having openings at positions corresponding to element isolation regions is formed on the Si$_3$N$_4$ layer by lithography. Anisotropic etching of the Si$_3$N$_4$ layer 27 and the silicon oxide layer 24 thereunder is performed by reactive ion etching using a gas such as CHF$_3$ and using the resist film as a mask. After the resist film is removed, using the remaining Si$_3$N$_4$ and silicon oxide layer 27 and 24 having a predetermined pattern as masks, anisotropic etching by reactive ion etching using CBrF$_3$ or the like is performed for the exposed region of the silicon semiconductor substrate 20 so as to form trenches 28. The depth of each trench 28 must be set to be sufficiently larger than that of a p-n junction formed between the n+-type layers 22 and the silicon semiconductor substrate 20.

Figure 2H:
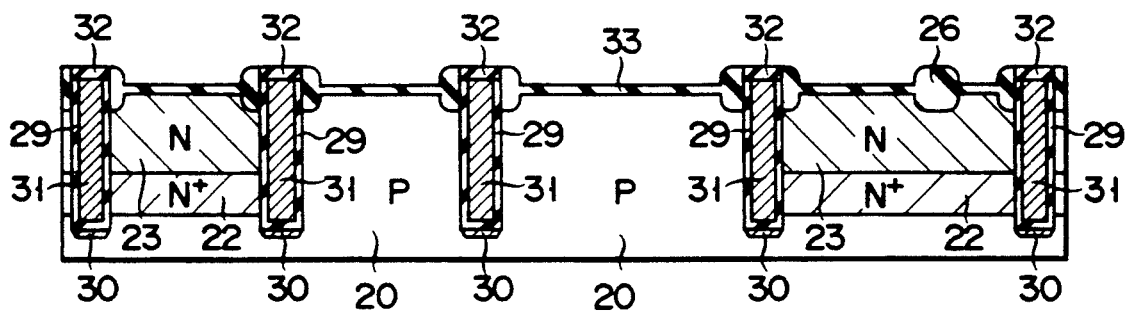

As shown in FIG. 2H, in each trench 28, an oxide layer, e.g., a silicon oxide layer 29, is formed by thermal oxidation. Thereafter, a channel stopper for preventing inversion is formed on the bottom portion of each trench 28. More specifically, B ions are implanted in the silicon semiconductor substrate 20 in the vertical direction at an acceleration voltage of 150 keV and a dose of $1 \times 10^{14}$ cm$^{-2}$. The resultant structure is then annealed at a temperature of 1,000° C. for 30 minutes to form a channel stopper 30 at the bottom portion of each trench 28. In addition, a polysilicon layer 31 is filled in each trench 28. An upper portion of each polysilicon layer 31 is oxidized to be converted into a 2,000-Å thick silicon oxide layer 32. The silicon nitride layer 27 is removed by chemical dry etching. This etching method is performed by using radicals shifted to a position apart from a plasma generated by a magnetron tube. Subsequently, the silicon oxide layer 24 between the polysilicon layers 31 as prospective element formation regions is removed, and a 500-Å thick gate oxide layer 33 is formed on these regions by thermal oxidation in an atmosphere of oxygen and HCl at a temperature of 950° C.

Figure 2I:
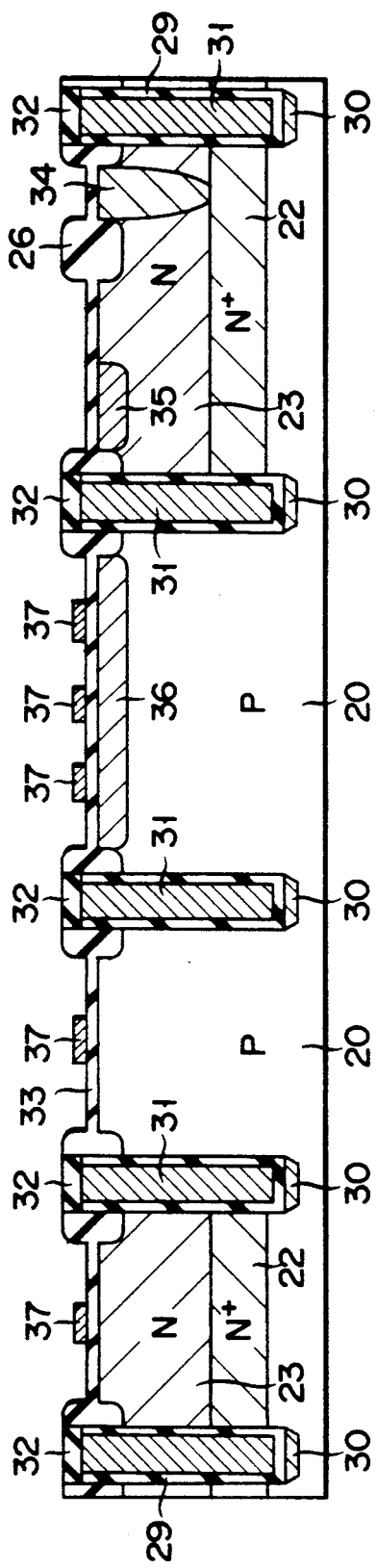

As shown in FIG. 2I, a p+-type impurity is ion-implanted at an acceleration voltage of 50 keV and a dose of $5 \times 10^{15}$ cm$^{-2}$ so as to form a deep n+-type region 34 in a prospective bipolar transistor formation region. The resultant structure is annealed in a nitrogen atmosphere maintained at a temperature of 1,100° C. for 30 minutes. In addition, $^{11}$B ions are implanted in a prospective base formation region of the bipolar transistor at an acceleration voltage 40 keV a dose of $1 \times 10^{13}$ cm$^{-2}$ so as to form a base region 35. Thereafter, channel implantation of an NchMOS transistor and of a PchMOS transistor is performed for predetermined prospective element formation regions, and ion implantation is performed for a predetermined prospective element region to form an n+-type buried channel 36 of a CCD. A 4,000-Å thick polysilicon layer 37 is deposited on predetermined portions of the gate oxide layer 33. In order to render the polysilicon layer 37 conductive, the layer 37 is sequentially exposed in a nitrogen atmosphere maintained at 950° C. for 10 minutes, a phosphorus oxychloride POCl$_3$ atmosphere for 30 minutes, and a nitrogen atmosphere for 10 minutes. Thereafter, PEP is performed for the polysilicon layer 37 to perform predetermined patterning.

Figure 2J:
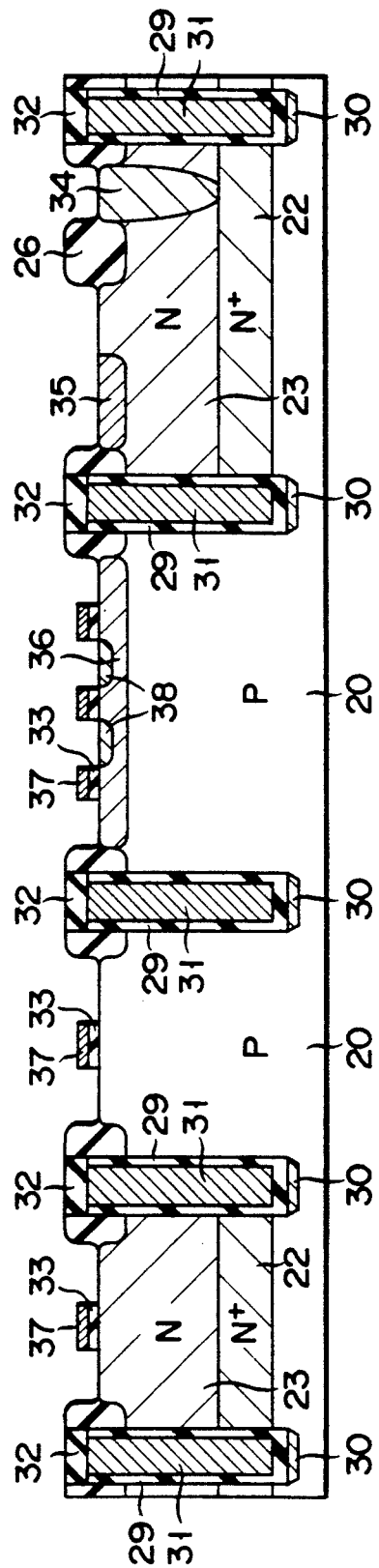

As shown in FIG. 2J, $^{11}$B is barrier-implanted in a prospective CCD formation region at an acceleration voltage of 40 keV and a dose of $7\times10^{11}$ cm$^{-2}$. The resultant structure is annealed in a nitrogen atmosphere maintained at a temperature of 900° C. for 30 minutes to form a buried channel layer 36. The gate oxide layer 33 arranged on the element formation regions and contaminated in the above-described steps is removed by etching. In this step, since the gate nitride layers 33 adjacent to the patterned polysilicon layers 37 are left, a two-layer structure shown in FIG. 2J is obtained.

Figure 2K:
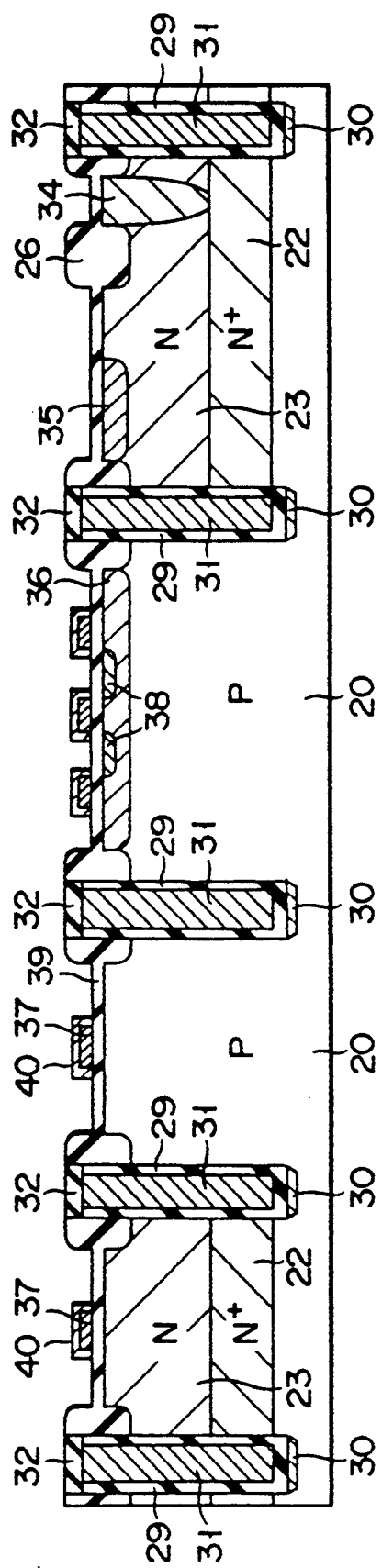

As shown in FIG. 2K, p-type impurity regions 38 are formed in the CCD region in the barrier implantation step. A silicon oxide layer 39 is formed to have a thickness of 500 Å by thermal oxidation in an HCl atmosphere maintained at a temperature of 950° C. In addition, an exposed surface of each polysilicon layer 37 is oxidized and covered with an oxide layer 40.

Figure 2L:
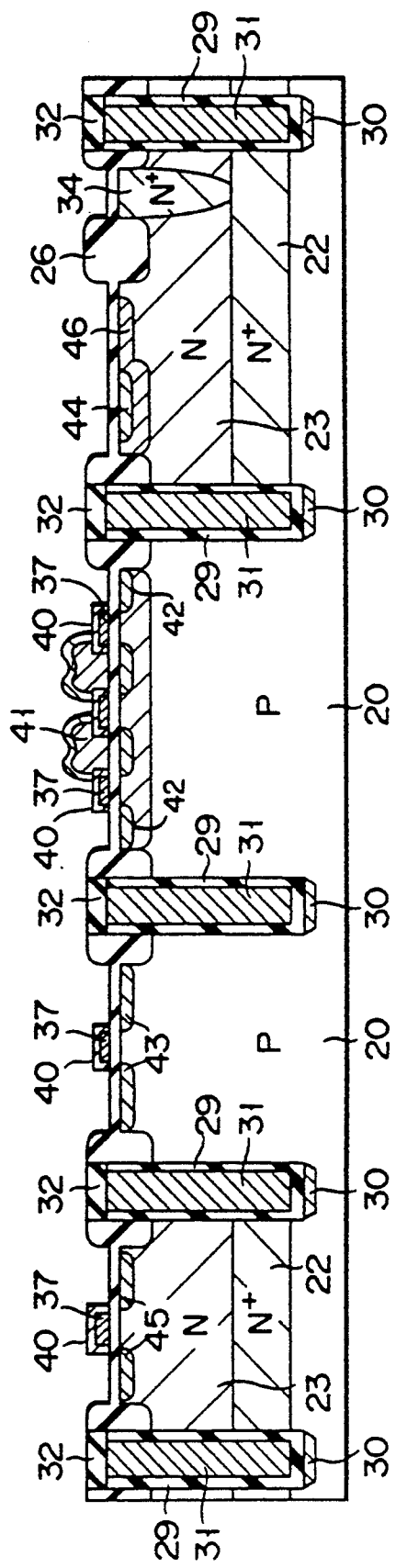
Figure 2M:
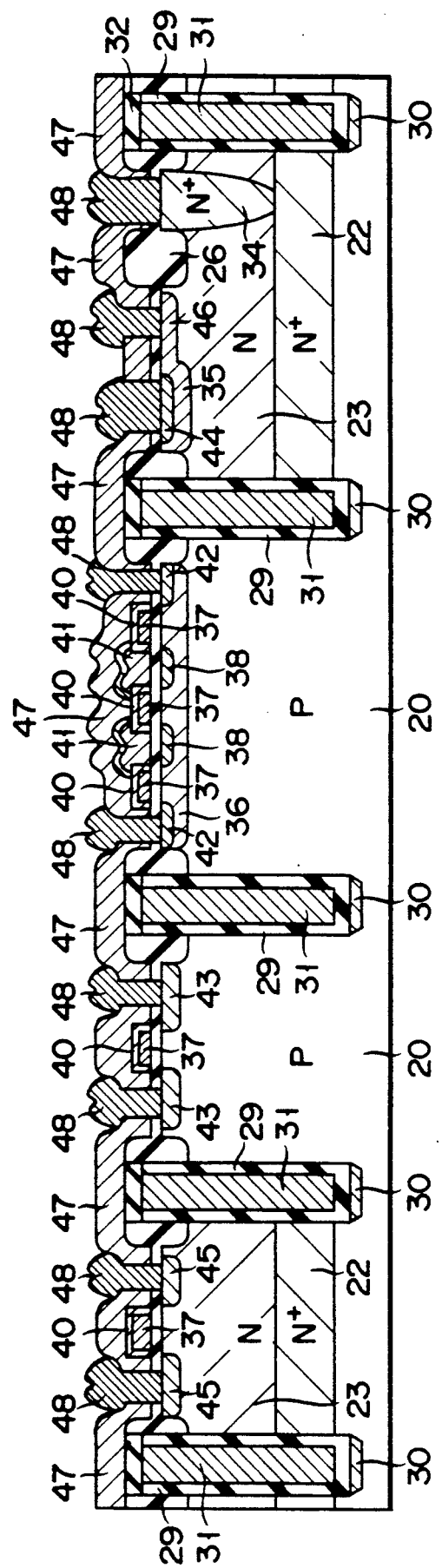

As shown in FIG. 2L, a 4,000-Å thick polysilicon layer 41 is formed on the major surface of the silicon semiconductor substrate 20. In order to render the polysilicon layer 41 conductive, the layer 41 is sequentially exposed in a nitrogen atmosphere maintained at a temperature of 950° C. for 10 minutes, a phosphorus oxychloride POCl$_3$ atmosphere for 30 minutes, and a nitrogen atmosphere for 10 minutes. Thereafter, the polysilicon layer 41 is subjected to PEP. In addition, the gate oxide layers 39 in an n$^+$-type region 42 for a CCD, in an n$^+$-type region 43 of an NchMOS, and in a prospective emitter formation region 44 are etched by n$^+$-type PEP. As$^+$ is ion-implanted in these regions at an acceleration voltage of 40 keV and a dose of $1\times10^{15}$ cm$^{-2}$. The resultant structure is then annealed in an oxygen atmosphere maintained at a temperature of 900° C. for 90 minutes to perform an activation process. In the last ion implantation process, $^{11}$B$^+$ is ion-implanted in a p-type region 45 of a PchMOS transistor and in a p$^+$-type base 46 of an npn bipolar transistor at an acceleration voltage of 40 keV and a dose of $1.5\times10^{15}$ cm$^{-2}$.

After this process, as shown in FIG. 2L, 3,000-Å thick a non-doped silicon oxide layer, a 9,000-Å thick BPSG (Boronphosphosilicate Glass) layer, and a 2,500-Å thick PSG (Phosphosilicate Glass) layer are deposited on the major surface of the silicon semiconductor substrate 20 as protective films of the respective elements by CVD. The resultant structure is exposed in a phosphorus oxychloride POCl$_3$ atmosphere for 30 minutes, and a nitrogen atmosphere for 5 minutes, thus forming an insulating layer 47.

After this process, contact PEP is performed together with sputtering and patterning to form 10,000-Å Al or Al alloy (Al-Si, Al-Si-Cu, or the like) layers 48. After sintering of these metal layers is performed, a CVD layer as the last protective film is deposited in a predetermined region and is subjected to pad PEP, thus obtaining a composite integrated circuit element.

Figure 1:
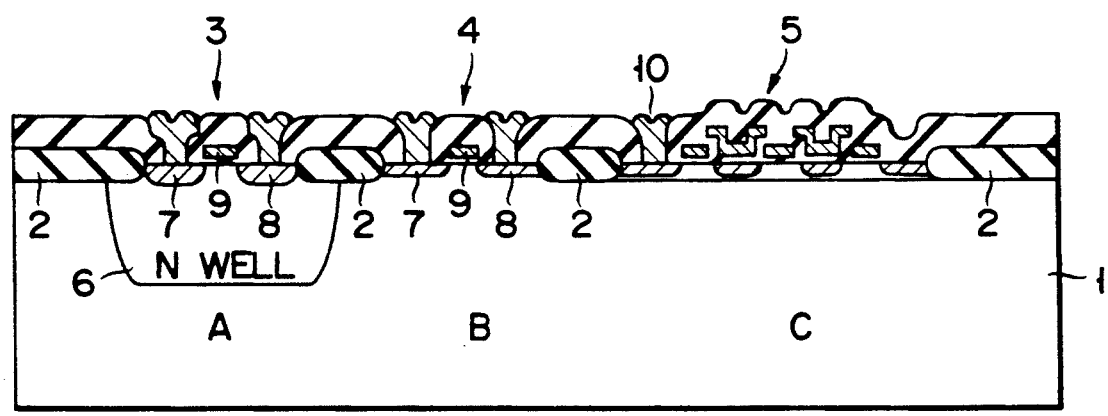
FIG. 1 is a sectional view showing a main part of a conventional composite integrated circuit element.

As described above, according to the composite semiconductor element of the present invention, since a CCD region is formed on a p-type semiconductor substrate, an element having substantially the same characteristics as those of the conventional structure shown in FIG. 1 can be obtained.

According to the conventional element, when a CCD is to be formed on a p-type epitaxial growth layer deposited on the entire major surface of a substrate, an impurity is undesirably diffused from a diffusion layer serving as a buried region during a growth operation, and the sheet resistance ($\rho$ps) (normally about 30 Ωcm) of the growth layer greatly varies. In addition, since control of such a sheet resistance is difficult, the yield in mass production is reduced. According to the above-described composite semiconductor element, a portion of the semiconductor substrate is removed in advance, and the bipolar transistor and the PchMOS transistor are formed on the selective epitaxial layer deposited on this portion, while the CCD and the NchMOS transistor are formed on the p-type semiconductor substrate as in the conventional element. The upper surfaces of the selective epitaxial layer and of the p-type semiconductor substrate are processed into substantially flat surfaces, thus allowing micropatterning.

When a buried epitaxial layer is to be mechanically polished, it is normally very difficult to stably polishing by a depth of 3 to 4 $\mu$m due to the limitations on process precision of a machine. If element isolation is performed by using buried epitaxial layer, the diffusion spread of the n$^+$-type epitaxial layer in the lateral direction is about 4 $\mu$m. In addition, when isolation is to be performed by means of a p-n junction, the distance between the n-type regions must be set to be about 20 $\mu$m. However, in the composite semiconductor element according to the present invention, since the n$^+$-type buried layer is formed in the entire upper surface of the element, and a trench isolation method using 2-$\mu$m wide trenches is performed, the area occupied by the element can be reduced, thus achieving micropatterning.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A composite semiconductor element, comprising:
   a semiconductor substrate having a main body portion and a non-epitaxial portion projecting from a planar surface of said main body portion;
   an epitaxial layer on the planar surface of said main body portion of said semiconductor substrate and surrounding said projecting non-epitaxial portion;
   insulating isolation regions in predetermined regions of said epitaxial layer, said non-epitaxial portion of said semiconductor substrate; and said main body portion of said semiconductor substrate to insulate and isolate said epitaxial layer and said non-epitaxial portion of said semiconductor substrate from each other and to define element regions in said epitaxial layer and in said non-epitaxial portion of said semiconductor substrate;
   an n-channel MOS transistor and a CCD element in respective element regions in said non-epitaxial portion of said semiconductor substrate; and
   a p-channel MOS transistor and a bipolar element in respective element regions in said epitaxial layer.

2. The composite semiconductor element according to claim 1, wherein said semiconductor substrate consists of monocrystalline silicon.

3. The composite semiconductor element according to claim 1, wherein a major surface of said island region and a major surface of said epitaxial layer constitute a substantially planar surface.

4. The composite semiconductor element according to claim 1, wherein the resistivity of said non-epitaxial portion of said semiconductor substrate is 20 Ω cm or less.

5. The composite semiconductor element according to claim 1, wherein said insulating isolation region comprise:
   trenches formed in predetermined regions of said epitaxial layer, said island region, and said semiconductor substrate; and
   polysilicon filled in said trenches.

6. The composite semiconductor element according to claim 5, wherein a channel stopper is arranged at a bottom portion of said insulating isolation regions.

* * * * *